United States Patent
Lee

(10) Patent No.: US 10,277,248 B2
(45) Date of Patent: Apr. 30, 2019

(54) COMPRESSION ENGINE WITH CONSISTENT THROUGHPUT

(71) Applicant: Tidal Systems, Inc., Santa Clara, CA (US)

(72) Inventor: Meng Kun Lee, Cupertino, CA (US)

(73) Assignee: Tidal Systems, Inc., Santa Clara, CA (US)

( * ) Notice: Subject to any disclaimer, the term of this patent is extended or adjusted under 35 U.S.C. 154(b) by 555 days.

(21) Appl. No.: 14/793,077

(22) Filed: Jul. 7, 2015

(65) Prior Publication Data

US 2017/0012641 A1   Jan. 12, 2017

(51) Int. Cl.
| | |
|---|---|
| *H03M 7/30* | (2006.01) |
| *G06F 17/30* | (2006.01) |
| *H04L 29/06* | (2006.01) |
| *G06F 15/16* | (2006.01) |
| *H04L 29/08* | (2006.01) |

(52) U.S. Cl.
CPC ........ *H03M 7/60* (2013.01); *G06F 17/30153* (2013.01); *H03M 7/30* (2013.01); *H03M 7/6017* (2013.01); *H04L 69/04* (2013.01); *H04L 67/327* (2013.01)

(58) Field of Classification Search
CPC . H03M 7/6017; H03M 7/60; G06F 17/30153; H04L 69/04
USPC ........................................................ 707/693
See application file for complete search history.

(56) References Cited

U.S. PATENT DOCUMENTS

| | | | | |
|---|---|---|---|---|
| 5,684,693 A  * | 11/1997 | Li ........................... | E21B 47/12 |
| | | | 702/6 |
| 6,145,069 A  * | 11/2000 | Dye ........................ | H03M 7/30 |
| | | | 345/501 |
| 6,519,733 B1 * | 2/2003 | Har ......................... | H03M 7/30 |
| | | | 714/758 |
| 6,879,631 B1 * | 4/2005 | Schultz ................... | H04N 19/44 |
| | | | 348/400.1 |
| 9,385,749 B1 * | 7/2016 | Nam ....................... | H03M 7/30 |
| 2001/0052038 A1* | 12/2001 | Fallon ..................... | H03M 7/30 |
| | | | 710/68 |
| 2002/0009000 A1* | 1/2002 | Goldberg ......... | G11B 20/00007 |
| | | | 365/200 |
| 2004/0228408 A1* | 11/2004 | Roelens ................. | H04N 5/783 |
| | | | 375/240.12 |
| 2007/0073941 A1* | 3/2007 | Brink ............... | G11B 20/00007 |
| | | | 710/68 |
| 2009/0287839 A1* | 11/2009 | Fallon ..................... | H04L 69/04 |
| | | | 707/999.101 |

(Continued)

*Primary Examiner* — Usmaan Saeed
*Assistant Examiner* — Brian E. Weinrich
(74) *Attorney, Agent, or Firm* — Brooks, Cameron & Huebsch, PLLC

(57) ABSTRACT

Systems and method provide for consistent throughput of one or more compression engines. Data received from an input stream is stored in a buffer. Data is read from the buffer and distributed to the compression engines. Latency of the compression engines is monitored. If latency exceeds a threshold, data is read from the buffer and written to an output stream simultaneously with reading of data and inputting it to the compression engines. Data from the input stream may be evaluated for likely compressibility and non-compressible data may be written to the output stream bypassing both the buffer and the compression engines.

20 Claims, 5 Drawing Sheets

(56) References Cited

U.S. PATENT DOCUMENTS

2015/0180936 A1* 6/2015 Ichien ................ H03M 7/6017
709/217

* cited by examiner

COMPRESSION ENGINE WITH CONSISTENT THROUGHPUT

FIELD OF THE INVENTION

This invention relates to systems and methods for compressing data.

BACKGROUND OF THE INVENTION

In many systems, data storage requirements and transmission bandwidth requirements are reduced by compressing data prior to storage or transmission. However, in order to take advantage of compression, the compression and decompression must be performed seamlessly. In particular, although some latency may be unavoidable, any decrease in throughput may be unacceptable.

The systems and methods disclosed herein provide an improved approach for compressing an input stream of data with consistent throughput.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
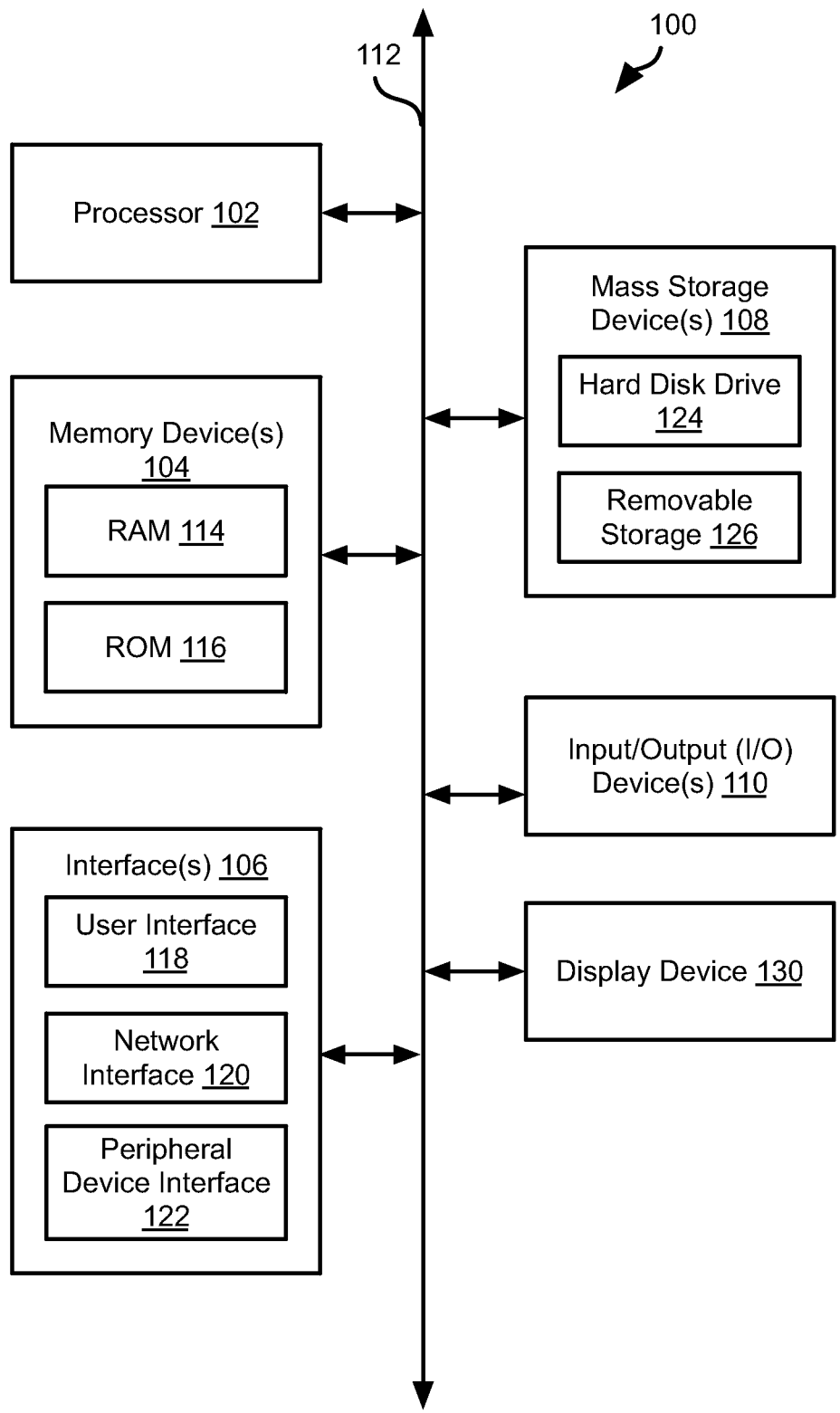
FIG. 1 is a schematic block diagram of a computing system suitable for implementing methods in accordance with embodiments of the invention.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The invention has been developed in response to the present state of the art and, in particular, in response to the problems and needs in the art that have not yet been fully solved by currently available apparatus and methods. Accordingly, the invention has been developed to provide apparatus and methods for storing and accessing data in a flash memory. In particular, the disclosed embodiment provides a method for compressing a stream of data with consistent throughput. Systems and method provide for consistent throughput of one or more compression engines. Data received from an input stream is stored in a buffer. Data is read from the buffer and distributed to the compression engines. Latency of the compression engines is monitored. If latency exceeds a threshold, data is read from the buffer and written to an output stream simultaneously with reading of data and inputting it to the compression engines. Data from the input stream may be evaluated for likely compressibility and non-compressible data may be written to the output stream bypassing both the buffer and the compression engines.

Embodiments in accordance with the present invention may be embodied as an apparatus, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "module" or "system." Furthermore, the present invention may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or flash memory) device, a portable compact disc read-only memory (CDROM), an optical storage device, and a magnetic storage device. In selected embodiments, a computer-readable medium may comprise any non-transitory medium that can contain, store, communicate, propagate, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like and conventional procedural programming languages, such as the "C" programming language or similar programming languages. The program code may execute entirely on a computer system as a stand-alone software package, on a stand-alone hardware unit, partly on a remote computer spaced some distance from the computer, or entirely on a remote computer or server. In the latter scenario, the remote computer may be connected to the computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions or code. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a non-transitory computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

FIG. 1 is a block diagram illustrating an example computing device 100. Computing device 100 may be used to perform various procedures, such as those discussed herein. Computing device 100 can function as a server, a client, or any other computing entity. Computing device can perform various monitoring functions as discussed herein, and can execute one or more application programs, such as the application programs described herein. Computing device 100 can be any of a wide variety of computing devices, such as a desktop computer, a notebook computer, a server computer, a handheld computer, tablet computer and the like.

Computing device 100 includes one or more processor(s) 102, one or more memory device(s) 104, one or more interface(s) 106, one or more mass storage device(s) 108, one or more Input/Output (I/O) device(s) 110, and a display device 130 all of which are coupled to a bus 112. Processor(s) 102 include one or more processors or controllers that execute instructions stored in memory device(s) 104 and/or mass storage device(s) 108. Processor(s) 102 may also include various types of computer-readable media, such as cache memory.

Memory device(s) 104 include various computer-readable media, such as volatile memory (e.g., random access memory (RAM) 114) and/or nonvolatile memory (e.g., read-only memory (ROM) 116). Memory device(s) 104 may also include rewritable ROM, such as flash memory.

Mass storage device(s) 108 include various computer readable media, such as magnetic tapes, magnetic disks, optical disks, solid-state memory (e.g., flash memory), and so forth. As shown in FIG. 1, a particular mass storage device is a hard disk drive 124. Various drives may also be included in mass storage device(s) 108 to enable reading from and/or writing to the various computer readable media. Mass storage device(s) 108 include removable media 126 and/or non-removable media.

I/O device(s) 110 include various devices that allow data and/or other information to be input to or retrieved from computing device 100. Example I/O device(s) 110 include cursor control devices, keyboards, keypads, microphones, monitors or other display devices, speakers, printers, network interface cards, modems, lenses, CCDs or other image capture devices, and the like.

Display device 130 includes any type of device capable of displaying information to one or more users of computing device 100. Examples of display device 130 include a monitor, display terminal, video projection device, and the like.

interface(s) 106 include various interfaces that allow computing device 100 to interact with other systems, devices, or computing environments. Example interface(s) 106 include any number of different network interfaces 120, such as interfaces to local area networks (LANs), wide area networks (WANs), wireless networks, and the Internet. Other interface(s) include user interface 118 and peripheral device interface 122. The interface(s) 106 may also include one or more user interface elements 118. The interface(s) 106 may also include one or more peripheral interfaces such as interfaces for printers, pointing devices (mice, track pad, etc.), keyboards, and the like.

Bus 112 allows processor(s) 102, memory device(s) 104, interface(s) 106, mass storage device(s) 108, and I/O device(s) 110 to communicate with one another, as well as other devices or components coupled to bus 112. Bus 112 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 100, and are executed by processor(s) 102. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

Figure 2:
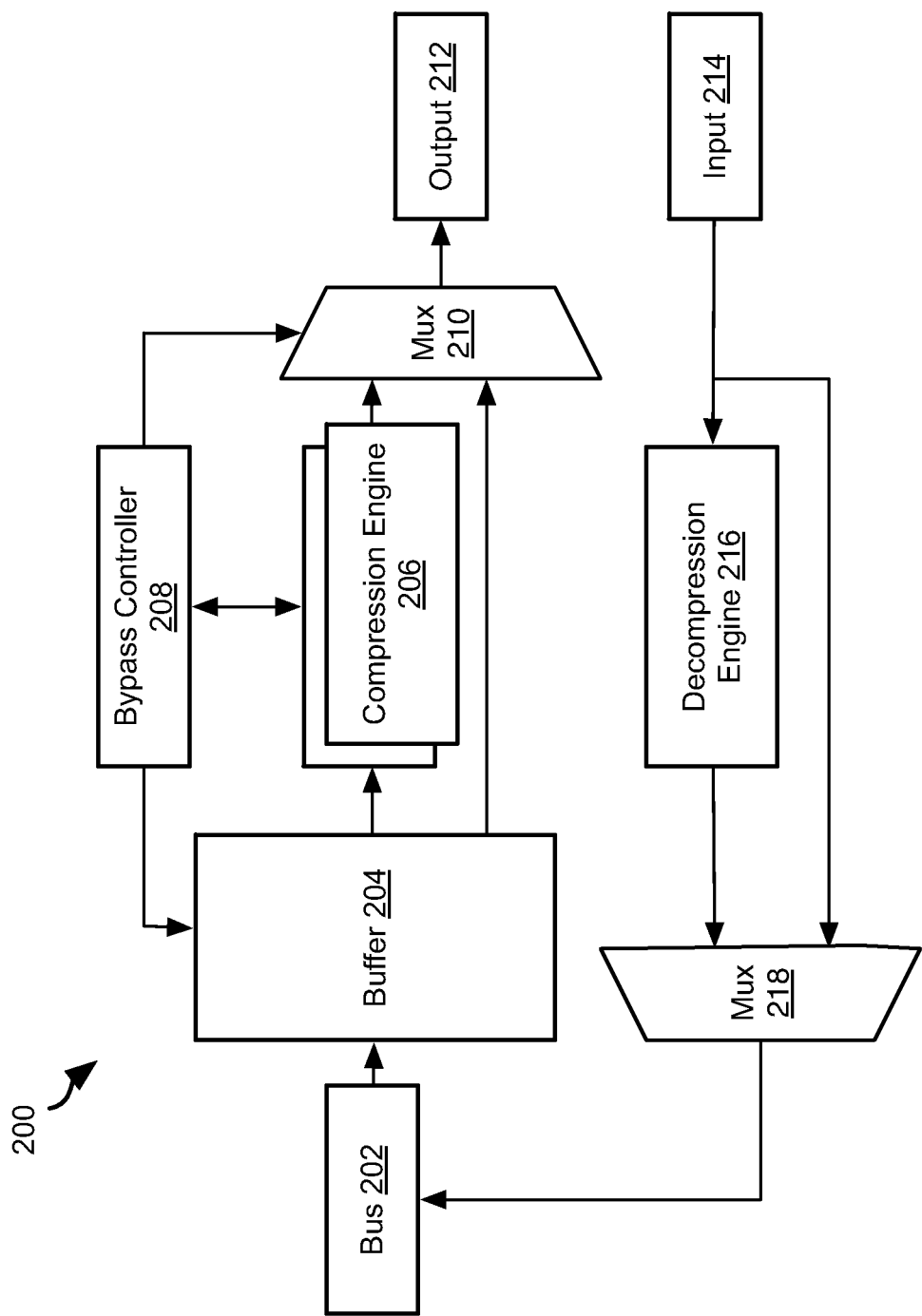
FIG. 2 is a schematic block diagram of components for performing compression of a data stream in accordance with an embodiment of the invention.

Referring to FIG. 2, the illustrated system 200 may perform data compression according to the methods disclosed herein. In particular, data may be received from a bus 202 or other input data stream, such as an interface to a storage device, network adapter, or some other device. Data received from the bus 202 may be stored in a buffer 204. The buffer 204 may advantageously be very large in order to accommodate bursts in data and provide consistent throughput. For example, the buffer 204 may store on the order of hundreds of megabytes (MB) or one or more gigabytes (GB).

Data from the buffer is input to one or more compression engines 206. The compression engines 206 may implement any compression algorithm, such as the DEFLATE algorithm, LZ77 algorithm, or some other compression algorithm. The compression engines 206 may be implemented as software modules executed by a general purpose processor, such as within different threads. The compression engines 206 may be implemented as dedicated hardware modules including circuits implementing the compression algorithm (e.g. an application specific integrated circuit (ASIC) implementing the compression algorithm).

Data compression can effectively increase the capacity of a storage device, reduce power consumption and enhance performance of the storage system. The use of data compression is very commonly found in SSD (solid state drive) and flash storage systems. The implementation can be done by software or hardware. Although the modern compression algorithm in software can achieve very high throughput by using the latest powerful CPU, it usually consumes more power and introduce more latency than custom hardware implementation. Furthermore, the compression throughput is usually not consistent as it heavily depends on the data content. Some data content may not be compressible, and hence introduces overhead that reduces the throughput of a hardware compression engine. Some data content is compressible, but the throughput can vary from one type of compressible data to another. The inconsistent throughput of the compression due to different data content results in the inconsistent performance for a flash storage drive from system point of view. The inconsistent performance for a storage system is very undesirable. The use of a buffer 204 may promote more consistent throughput, but is not always able to do so. The systems and methods disclosed herein provide an improved approach for providing consistent throughput.

In particular, one or both of a bypass controller 208 and multiplexer 210 may be added to the buffer 204 and compression engine 206. The bypass controller 208 and the functionalities ascribed thereto may be implemented by a device exclusively programmed to perform these functions or a controller or processor programmed to perform other functions, including general purpose processing.

In particular, the buffer 204 may be implemented as a first in first out (FIFO) buffer. Input data words are written to the buffer and read from the buffer in the order in which they were received. Note that the buffer 204 is not necessary in some embodiments as input data words can go into directly compression engine or Mux 210. When a data word is read or "popped" from the buffer an output pointer may be incremented or otherwise modified to point to the location of the next data word. The bypass controller 208 may read or pop entries from the buffer 204 and distribute them to the compression engines 206 exclusively or directly to the output 212. An example method by which the bypass controller 208 distributes entries from the buffer 204 is described in greater detail with respect to FIG. 3. The bypass controller 208 may select inputs of a multiplexer (MUX) 210 in order to couple both compressed and uncompressed entries from the buffer 204 to the output 212.

Data to be decompressed may be received from an input 214, such as from a storage device responsive to a read request or as data received over a transmission channel, which may include the bus 202. Data received may be processed to determine whether it has been compressed. If it is determined to have been compressed, it is input to the decompression engine 216. If not, it is sent to an output, such as the bus 202 without decompression. Determining whether data has been compressed may be performed by the bypass controller 208 or some other control device. A mux 218 may be controlled in order to select which of the bypass data or the output of the decompression engine 216 to couple to the output, e.g. the bus 202 in the illustrated embodiment.

Figure 3:
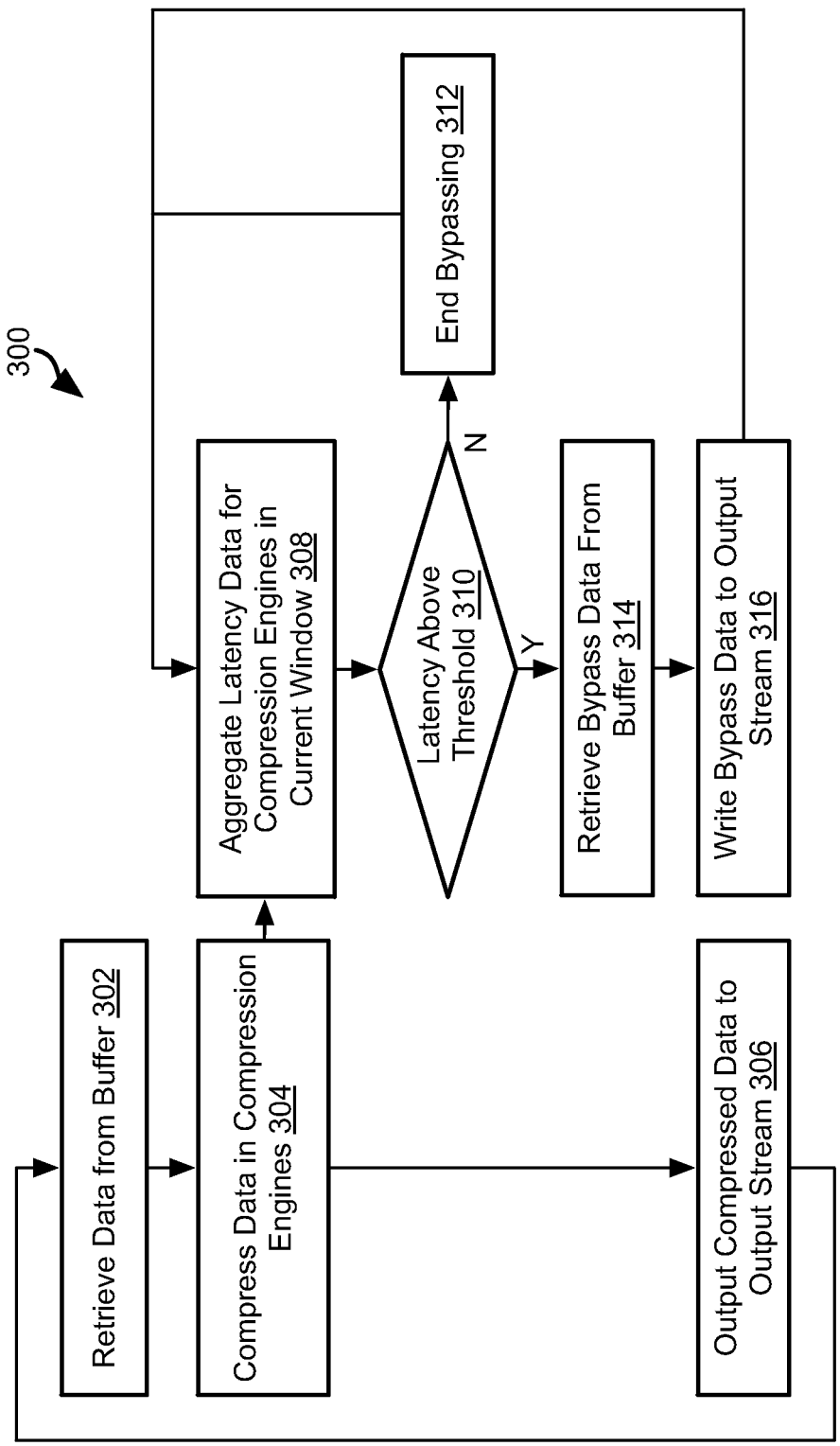
FIG. 3 is a process flow diagram of a method for compressing data with consistent throughput in accordance with an embodiment of the invention.

FIG. 3 illustrates a method 300 that may be performed by the illustrated system 200 or some other system. The method may include retrieving 302 data from the buffer 204, compressing 304 the retrieved data in one or more compression engines 206, and outputting 306 compressed data from the compression engines 206 to an output stream 212. The method by which data is compressed 304 and output to an output stream 212 may include any methods known in the art for compressing a data stream. In some implementations data read from the buffer 204 at each execution of the step 302 may be a block of data, such as a logical block address (e.g. 4 kB or other sized LBA), page, or some other block of multiple data words.

In parallel with the reading, compressing, and outputting steps 302-306, the method 300 may include periodically aggregating 308 latency data for the one or more compression engines 206 in a preceding time window, e.g. the previous 1 ms, 2 ms, or some other period preceding execution of step 308. Latency may be determined at step 308 periodically with a period that is smaller than or larger than the time window. Latency may be measured as the number of clock cycles per data block compressed in the time window, as the number of data blocks compressed in the time window, or some other measure of latency. Latency data may be summed and/or averaged and this used as the aggregate latency for comparison to the threshold.

If the latency if found 310 to be above a predetermined threshold, i.e. a target latency value set by a manufacturer or received from a user, then data may be retrieved 314 from the buffer 204 and written 316 to the output stream 212, bypassing the one or more compression engines 206. As for step 302, data may be retrieved 314 and written 316 as blocks of data such as logical block addresses (LBA), pages, or some other sized block of data including multiple data words. As noted above, steps 314-316 may be performed simultaneously or in an interleaved fashion with execution of the steps 304 and 306. For example, 50% of data read from the buffer 204 may be written 316 to the output stream by bypassing the compression engines and 50% may be compressed 304 and written 306 to the output stream. For example, data words N+1, N+3, N+5, N+7, etc. may be compressed 304 and output 306 and data words N+2, N+4, N+6, etc. may be written 316 to the output stream 212, bypassing the compression engines 206. The percentage of words selected for bypassing may vary and may be proportion to the magnitude of latency determined at step 308 or an amount by which the latency exceeds the threshold.

Steps 308 and 310 may be performed periodically such that if it is determined 310 that the latency of the compression engines performing the compression 304 is below the threshold, then bypassing may end 312 such that steps 314, 316 are not performed until the latency is again found 310 to be above the threshold.

Figure 4:
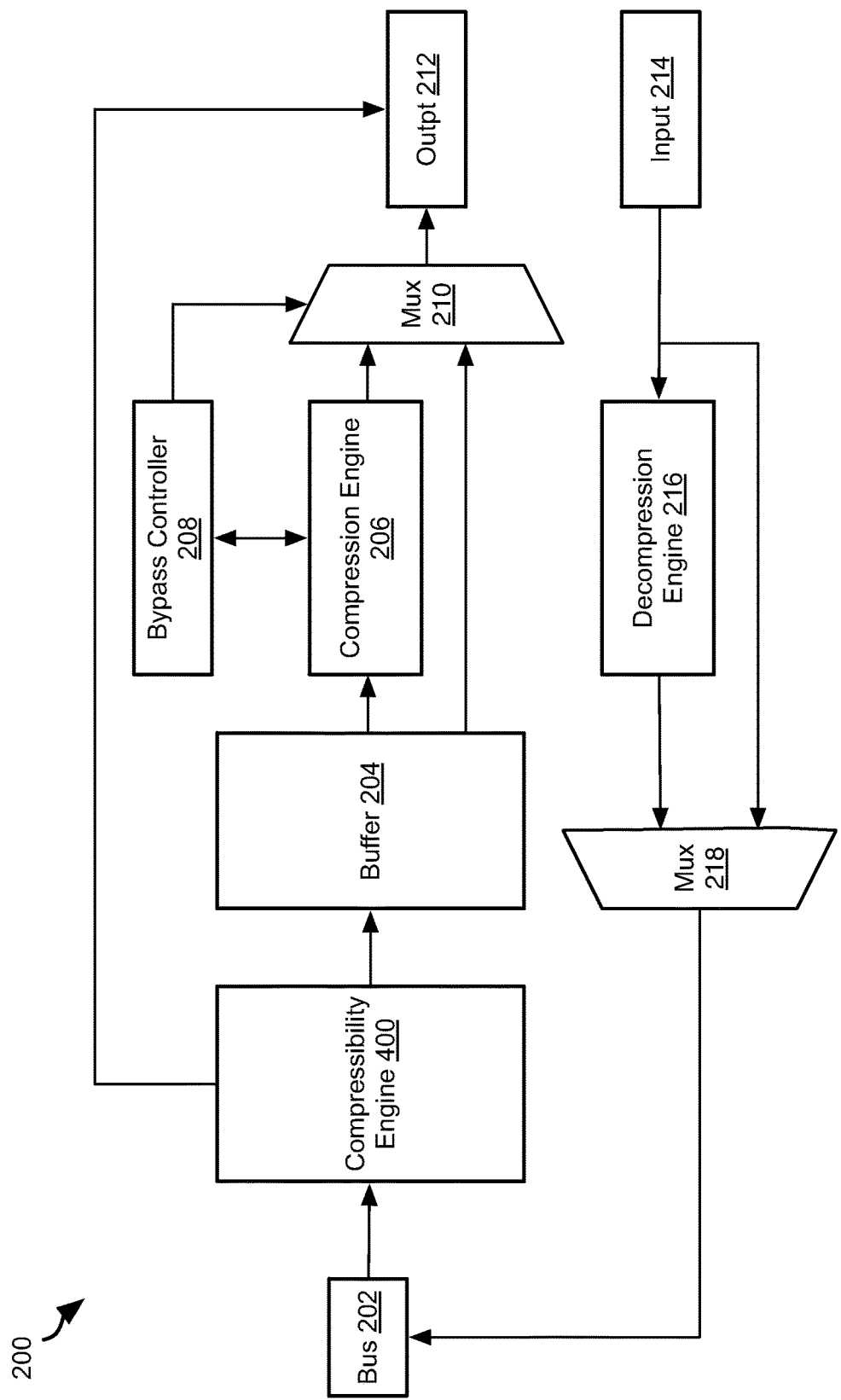
FIG. 4 is a schematic block diagram of an alternative system for performing compression of a data stream in accordance with an embodiment of the invention.

Referring to FIG. 4, in some embodiments, the throughput of a compression system may be further enhanced by evaluating the compressibility of input data and writing data determined unlikely to be compressible directly to the output 212. For example, a compressibility engine 400 may receive data from the bus 202 and evaluate its compressibility. Data determined to likely be compressible is written to the buffer 204 and processed as described above with respect to FIGS. 2 and 3. Data determined to be unlikely to be compressible, is written directly to the output stream 212 thereby bypassing both of the buffer 204 and compression engines 206. The methods by which data is determined to be compressible may include those disclosed in U.S. patent application Ser. No. 14/293,850 (hereinafter "the '850 Application") filed Jun. 2, 2014 and entitled STATISTICAL COMPRESSIBILITY DETERMINATION SYSTEM AND METHOD, which is hereby incorporated herein by reference for all purposes.

Figure 5:
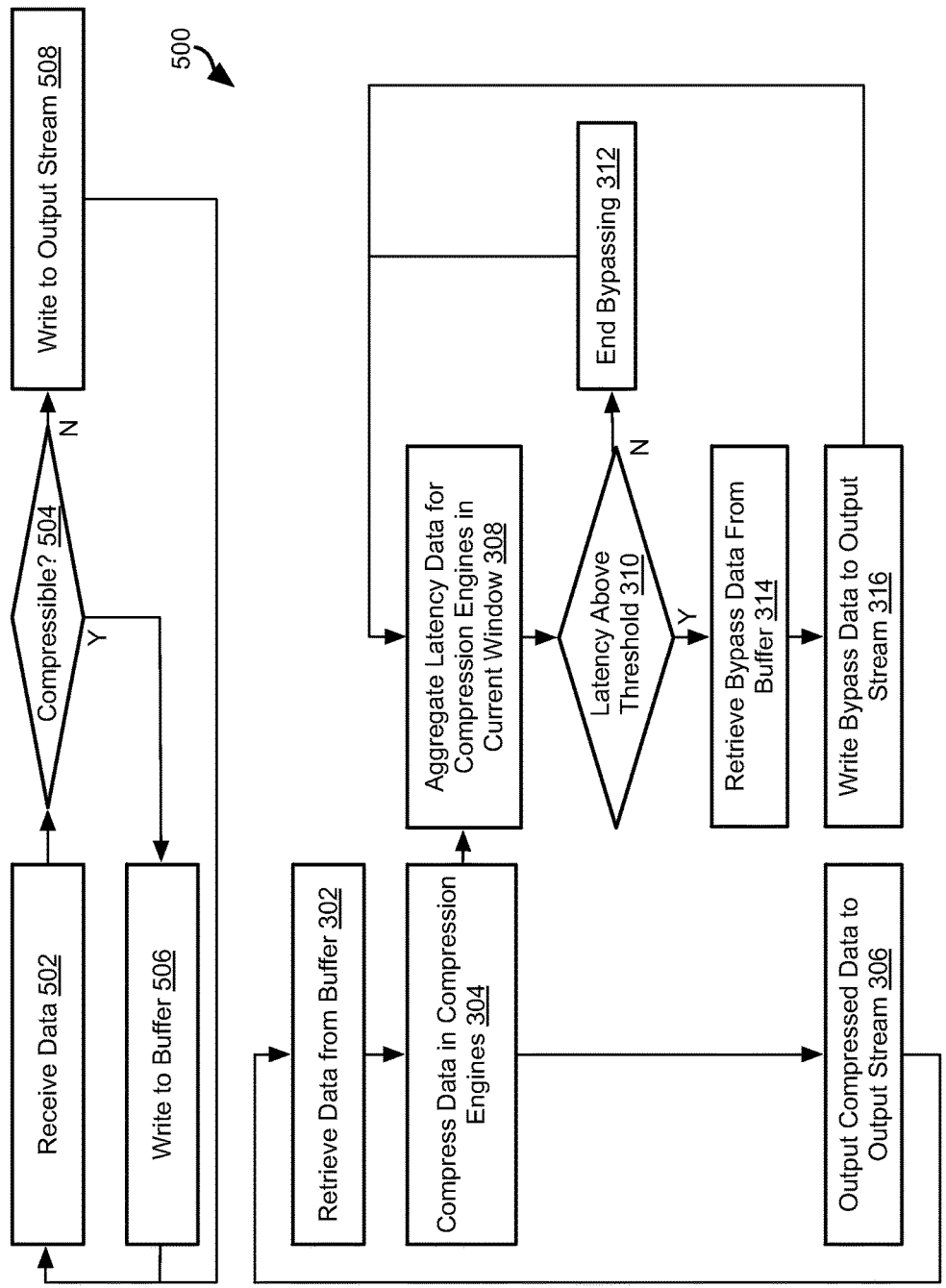
FIG. 5 is a process flow diagram of an alternative method for compressing data with consistent throughput in accordance with an embodiment of the invention.

Referring to FIG. 5, for the system 400, the illustrated method 500 may be performed. As is readily apparent, the steps of the method 300 may be performed simultaneously (e.g. in parallel or interleaved with) the additional steps 502-508 of the method 500. In particular, data may be received 502 (e.g. as an LBA, page, or other data block) and evaluated 504 to determine its compressibility according to the methods of the '850 Application. If the received data is found 504 to be compressible it is written to the buffer 302. Data written to the buffer is subsequently retrieved 302 and/or 314 in the same manner as for the method 300 described above. If the received data is not found 504 to be compressible it is written 508 to the output stream, bypassing both the buffer 204 and the compression engines 206.

In an alternative embodiment to that disclosed in FIGS. 4 and 5, data received from the bus 202 is written to the buffer 204 regardless of compressibility. The compressibility engine may be downstream from the buffer 204. For example, entries of the buffer 204 that are not coupled to the output stream by bypass controller 208 may be input to the compressibility engine 400. Entries found to be compressible are input by the compressibility engine 400 to the compression engine 206, compressed, and written to the output 212. Entries not found to be compressible by the compressibility engine 400 are written to the output 212.

The present invention may be embodied in other specific forms without departing from its spirit or essential characteristics. The described embodiments are to be considered in all respects only as illustrative, and not restrictive. In particular, although the methods are described with respect to a nand flash SSD, other SSD devices or non-volatile storage devices such as hard disk drives may also benefit from the methods disclosed herein. The scope of the invention is, therefore, indicated by the appended claims, rather than by the foregoing description. All changes which come within the meaning and range of equivalency of the claims are to be embraced within their scope.

What is claimed is:

1. A method for compressing data, the method comprising:
   receiving, by an electronic device, an input data stream;
   determining, by the electronic device, compressibility of data from the input data stream;
   writing, by the electronic device, data from the input data stream determined to be uncompressible data to the output data stream bypassing a buffer and one or more compression engines, wherein a bypass controller selects the uncompressible data to be an input of a multiplexer to couple the uncompressible data with compressed data to be written to the output data stream;
   storing, by the electronic device, data from the input data stream determined to be compressible in the buffer;
   distributing, by the electronic device, first data in the buffer to the one or more compression engines;
   compressing, by the one or more compression engines, the first data to generate compressed first data and writing the compressed first data to an output data stream;
   monitoring, by the electronic device, latency of the one or more compression engines;
   periodically evaluating, by the electronic device, latency of the one or more compression engines within a time window with respect to a threshold by summing, in parallel with the compressing of the first data, latency data for the one or more compression engines in the time window to determine a summed latency;
   determining, by the electronic device, at a first point in time that the summed latency within the time window exceeds the threshold;
   in response to determining that at the first point in time that the summed latency within the time window exceeds the threshold, distributing, by the electronic device, second data in the buffer to both of the one or more compression engines and the output stream such that a first portion of the second data is distributed to the one or more compression engines and a second portion of the second data is written to the output stream and bypasses the one or more compression engines, wherein the percentage of data words selected for bypassing is proportional to an amount by which the summed latency exceeds the threshold; and
   compressing, by the one or more compression engines, the first portion of the second data to generate second compressed data and writing the compressed second data to the output data stream.

2. The method of claim 1, further comprising:
   determining, by the electronic device, at a second point in time subsequent to the first point in time that the summed latency of the one or more compression engines is below the threshold;
   in response to determining that at the second point in time that the summed latency within the time window does not exceed the threshold, distributing, by the electronic device, third data in the buffer exclusively to the one or more compression engines; and
   compressing, by the one or more compression engines, the third data to generate third compressed data and writing the third compressed data to the output data stream.

3. The method of claim 1, wherein storing, by the electronic device, the data from the input data stream in the buffer comprises:
   determining that a first portion of the data stream meets a threshold compressibility; and
   in response to determining that the first portion of the input data stream meets a threshold storing a first portion of the input data stream in the buffer.

4. The method of claim 3, further comprising:
   determining that a second portion of the input data stream does not meet the threshold compressibility;
   in response to determining that the second portion of the input data stream does not meet the threshold compressibility, writing the second portion of the input data stream to the output data stream without storing the second portion of the input data stream in the buffer and without inputting the second portion of the input data stream to the one or more compression engines.

5. The method of claim 1, wherein determining, by the electronic device, at the first point in time that the summed latency within the time window exceeds the threshold comprises determining that an aggregate of processing cycles per data block compressed by the one or more compression engines exceeds the threshold.

6. The method of claim 1, wherein the one or more compression engines are a plurality of compression engines.

7. The method of claim 1, wherein the output stream is an input of a storage device.

8. The method of claim 1, wherein the output stream is an input of a solid state drive device.

9. The method of claim 1, wherein the output stream is a network transmission channel.

10. The method of claim 1, further comprising:
    receiving the output stream;
    detecting that the first and second compressed data are compressed;
    in response to determining that the compressed first and second data are compressed, decompressing the first and second data;
    determining that the second portion of the second data is not compressed; and
    in response to determining that the second portion of the second data is not compressed, refraining from decompressing the second portion of the second data.

11. The method of claim 1, wherein the control module is further programmed to decompress received data by:
- detecting compressed data in the received data;
- decompressing the compressed data;
- detecting non-compressed data in the received data; and
- refrain from decompressing the non-compressed data.

12. A system for compressing data, the system comprising:
- a buffer;
- one or more compression engines;
- a control module programmed to
  - receive an input data stream;
  - determine compressibility of data from the input data stream;
  - write data from the input data stream determined to be uncompressible data to the output data stream bypassing the buffer and the one or more compression engines, wherein a bypass controller selects the uncompressible data to be an input of a multiplexer to couple the uncompressible data with compressed data to be written to the output data stream;
  - store data from the input data stream determined to be compressible in the buffer;
  - distribute first data in the buffer to the one or more compression engines such that the one or more compression engines compress the first data to generate compressed first data and write the compressed first data to an output data stream;
  - monitor latency of the one or more compression engines;
  - periodically evaluate latency of the one or more compression engines within a time window with respect to a threshold by summing, in parallel with the compressing of the first data, latency data for the one or more compression engines in the time window to determine a summed latency; and
  - when the summed latency of the one or more compression engines within the time window exceeds the threshold, distribute a first portion of second data in the buffer to both of the one or more compression engines and a second portion of the second data directly to the output data stream bypassing the one or more compression engines, wherein the percentage of data words selected for bypassing is proportional to an amount by which the summed latency exceeds the threshold.

13. The system of claim 12, wherein the control module is further programmed to:
- when the summed latency of the one or more compression engines within the time window ceases to exceed the threshold, distribute the data in the buffer exclusively to the one or more compression engines.

14. The system of claim 12, wherein the control module is further programmed to:
- evaluate compressibility of the input data stream with respect to a compressibility threshold;
- write a compressible portion of the input data stream that meets the compressibility threshold to the buffer;
- write a non-compressible portion of the input data stream that does not meet the compressibility threshold to output stream and bypassing the buffer and one or more compression engines.

15. The system of claim 14, wherein the control module is further configured to evaluate summed latency of the one or more compression engines within a time window with respect to the threshold by evaluating an aggregate of processing cycles per data block compressed by the one or more compression engines exceeds the threshold.

16. The system of claim 12, wherein the one or more compression engines are a plurality of compression engines.

17. The system of claim 16, wherein the plurality of compression engines are hardware modules.

18. The system of claim 12, wherein the output stream is an input of a storage device.

19. The system of claim 12, wherein the output stream is an input of a solid state drive device.

20. The system of claim 12, wherein the output stream is a network transmission channel.

* * * * *